(12) United States Patent
Peng

(10) Patent No.: US 10,319,800 B2
(45) Date of Patent: Jun. 11, 2019

(54) OLED DISPLAY SCREEN

(71) Applicant: Wuhan China Star Optoelectronics Technology Co., Ltd., Wuhan, Hubei (CN)

(72) Inventor: Haibo Peng, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 111 days.

(21) Appl. No.: 15/308,576

(22) PCT Filed: Aug. 12, 2016

(86) PCT No.: PCT/CN2016/094896
§ 371 (c)(1),
(2) Date: Nov. 2, 2016

(87) PCT Pub. No.: WO2017/219462
PCT Pub. Date: Dec. 28, 2017

(65) Prior Publication Data
US 2018/0190749 A1 Jul. 5, 2018

(30) Foreign Application Priority Data
Jun. 20, 2016 (CN) .......................... 2016 1 0447016

(51) Int. Cl.
*H01L 51/52* (2006.01)
*H01L 27/32* (2006.01)
(52) U.S. Cl.
CPC ...... *H01L 27/3272* (2013.01); *H01L 27/3276* (2013.01); *H01L 27/3211* (2013.01); *H01L 51/5284* (2013.01)

(58) Field of Classification Search
None
See application file for complete search history.

(56) References Cited

U.S. PATENT DOCUMENTS

| 5,463,481 | A | 10/1995 | Yamamura | |
| 6,879,319 | B2 * | 4/2005 | Cok | ....................... G06F 3/0412 345/173 |

(Continued)

FOREIGN PATENT DOCUMENTS

| CN | 103941464 A | 7/2014 |
| CN | 105374845 A | 3/2016 |

*Primary Examiner* — Michael Lebentritt
(74) *Attorney, Agent, or Firm* — Andrew C. Cheng

(57) ABSTRACT

An OLED display screen belonging to an OLED display screen technical field includes a first substrate, a second substrate, an OLED light-emitting layer and a metallic signal line. The first substrate and the second substrate are disposed opposite. The OLED light-emitting layer and the metallic signal line are both disposed between the first substrate and the second substrate. A light block layer is disposed between the first substrate and the second substrate. All or a section of the light block layer is disposed between the metallic signal line and the first substrate. The light block layer is applied to prevent incidence of natural light and/or reflective light generated by the metallic signal line. The disclosure can shelter the metallic signal line by the light block layer to absorb reflective light of the metallic signal line, a polarizer can be omitted. The structure is simple and illuminous efficiency is improved.

14 Claims, 2 Drawing Sheets

(56) References Cited

U.S. PATENT DOCUMENTS

| | | | | |
|---|---|---|---|---|
| 7,344,901 B2* | 3/2008 | Hawtof | ............... | B32B 27/00 |
| | | | | 257/E21.499 |
| 8,077,162 B2* | 12/2011 | Endo | ............... | G06F 3/0488 |
| | | | | 178/18.01 |
| 8,164,257 B2* | 4/2012 | Choi | ............... | H01L 27/3276 |
| | | | | 313/504 |
| 8,299,705 B2* | 10/2012 | Choi | ............... | H01L 51/5246 |
| | | | | 313/512 |
| 8,319,709 B2* | 11/2012 | Ito | ............... | G06F 3/044 |
| | | | | 345/173 |
| 8,415,880 B2* | 4/2013 | Choi | ............... | C03C 8/24 |
| | | | | 313/512 |
| 8,440,479 B2* | 5/2013 | Nguyen | ............... | H01L 51/448 |
| | | | | 313/512 |
| 8,723,413 B2* | 5/2014 | Chen | ............... | G06F 3/0412 |
| | | | | 313/504 |
| 9,028,932 B2* | 5/2015 | Van Dijk | ............... | C03C 27/06 |
| | | | | 174/255 |
| 9,395,857 B2* | 7/2016 | Wu | ............... | G06F 3/044 |
| 9,893,126 B2* | 2/2018 | Jang | ............... | H01L 27/323 |
| 2005/0200296 A1* | 9/2005 | Naugler, Jr. | ............... | H05B 37/02 |
| | | | | 315/150 |
| 2011/0043479 A1* | 2/2011 | van Aerle | ............... | G06F 1/1601 |
| | | | | 345/174 |
| 2013/0201134 A1* | 8/2013 | Schneider | ............... | G06F 3/041 |
| | | | | 345/173 |
| 2014/0204315 A1* | 7/2014 | Park | ............... | G02F 1/136286 |
| | | | | 349/65 |
| 2015/0346866 A1* | 12/2015 | Kusunoki | ............... | G06F 1/1652 |
| | | | | 345/174 |
| 2016/0092717 A1* | 3/2016 | Ling | ............... | G06K 9/0004 |
| | | | | 382/125 |

* cited by examiner

OLED DISPLAY SCREEN

CROSS REFERENCE

This disclosure claims priority to Chinese patent application No. 201610447016.6, entitled "OLED DISPLAY SCREEN" filed on Jun. 20, 2016, which is incorporated by reference in its entirety.

FIELD OF THE DISCLOSURE

The disclosure relates to a structure of a display screen, and more particularly to an OLED display screen.

BACKGROUND OF THE DISCLOSURE

In a conventional organic light-emitting diode (OLED) display screen, its light-emitting layer is disposed with various metallic signal lines, such as a metallic signal line applied in signal transmission, or a metallic signal line of a switch of a TFT component. But the metallic signal lines can generate reflective light under illumination of external light, the reflective light strongly affects a display effect of the OLED display screen.

To solve the problem, a conventional OLED display screen is covered by a linear polarizer, a ¼ wave plate and top glass from inside to outside on its surface in sequence. As the external light is non-polarized natural light, after the natural light penetrates the linear polarizer, if a transmission axis of the polarizer is along the vertical Y axis, the natural light penetrating the linear polarizer will be converted to be linear polarized light in the Y direction, the linear polarized light subsequently penetrates the ¼ wave plate to be converted to be dextrorotatory rotatory polarized light, the dextrorotatory rotatory polarized light will be converted to be levorotatory rotatory polarized light after reflection of the top glass, the levorotatory rotatory polarized light will be converted to be linear polarized light vibrated along the X direction after being returned by the ¼ wave plate, as the linear polarizer merely permits the light vibrating along Y to pass, polarized light along X will be absorbed by the linear polarizer. The metallic signal line is disposed below the top glass, its reflective light needs to penetrate the top glass and the ¼ wave plate in sequence to reach the linear polarizer, obviously, the reflective light of the metallic signal line cannot be converted to be the linear polarized light vibrated along Y, which is the reflective light generated by the metallic signal line will be absorbed by the linear polarizer, so as to achieve a purpose of eliminating light reflected by the metallic signal line.

Accordingly, the linear polarizer will also absorb light generated by the OLED display screen, as a result, at least half of the optical energy generated by the OLED display screen is absorbed, which reduces luminous efficiency of the OLED display screen significantly.

SUMMARY OF THE DISCLOSURE

An objective of the disclosure is to provide an OLED display screen, the OLED display screen solves a problem that a conventional OLED display screen cannot prevent light reflected by a metallic signal line and ensure illuminous efficiency simultaneously.

To solve the technical problem above, the disclosure provides an OLED display screen, including a first substrate, a second substrate, an OLED light-emitting layer and a metallic signal line. The first substrate and the second substrate are disposed opposite. The OLED light-emitting layer and the metallic signal line are both disposed between the first substrate and the second substrate. A light block layer is disposed between the first substrate and the second substrate. All or a section of the light block layer is disposed between the metallic signal line and the first substrate. The light block layer is applied to prevent incidence of natural light and/or emission of reflective light generated by the metallic signal line.

The light block layer is fixed on an internal surface of the first substrate. A surface of the metallic signal line opposite to the light block layer is disposed within a range covered by the light block layer.

The light block layer is fixed on a surface of the metallic signal line opposite to the first substrate. A surface of the metallic signal line opposite to the light block layer is disposed within a range covered by the light block layer.

The OLED light-emitting layer is an RGB light-emitting layer. The RGB light-emitting layer includes a red light emitter, a green light emitter and a blue light emitter. The red light emitter, the green light emitter and the blue light emitter are disposed abreast and separately.

A mounting groove is formed between two of the red light emitter, the green light emitter and the blue light emitter respectively. The metallic signal line is disposed in the mounting groove.

The light block layer is fixed in an internal surface of the first substrate. A position of the light block layer is corresponding to a position of the mounting groove. The light block layer is embedded in the mounting groove. A surface of the metallic signal line opposite to the light block layer is disposed within a range covered by the light block layer.

The light block layer is disposed in the mounting groove. The light block layer is fixed on a surface of the metallic signal line opposite to the first substrate. A surface of the metallic signal line opposite to the light block layer is disposed within a range covered by the light block layer.

The OLED light-emitting layer is an RGB light-emitting layer. The RGB light-emitting layer includes a red light emitter, a green light emitter and a blue light emitter. The red light emitter, the green light emitter and the blue light emitter are disposed abreast and separately. The light block layer is fixed on an internal surface of the first substrate. A surface of the metallic signal line opposite to the light block layer is disposed within a range covered by the light block layer.

The OLED light-emitting layer is an RGB light-emitting layer. The RGB light-emitting layer includes a red light emitter, a green light emitter and a blue light emitter. The red light emitter, the green light emitter and the blue light emitter are disposed abreast and separately. The light block layer is fixed on a surface of the metallic signal line opposite to the first substrate. A surface of the metallic signal line opposite to the light block layer is disposed within a range covered by the light block layer.

The light block layer is a light filter, a black matrix or a flat layer.

In the conventional technique, as the surface of the OLED display screen is disposed with a polarizer, the polarizer will absorb light generated by the OLED light-emitting layer, which leads to illuminous efficiency of the OLED display screen to be reduced significantly. In order to solve the problem, no polarizer will be disposed according to the disclosure, which can simplify the structure and reduce costs, as well as avoiding the problem that the polarizer absorbs optical energy of the OLED display screen, so as to improve illuminous efficiency of the OLED display screen significantly. Moreover, in order to solve the problem of the metallic signal line reflecting light, the disclosure disposes the first substrate and the second substrate opposite, and disposes the OLED light-emitting layer, the metallic signal line and the light block layer between the first substrate and the second substrate, as all or a section of the light block layer is disposed between the metallic signal line and the first substrate, the light block layer will shelter the metallic signal line from light, such as some light block layer can prevent optical penetration, thereby external natural light will be blocked by the light block layer after penetrating the first substrate, the natural light will not be reflected by the surface of the metallic signal line due to prevention by the light block layer. Overall, removal of the polarizer and disposition of the light block layer according to the disclosure improve illuminous efficiency of an OLED display screen and prevent the problem of light reflected by the metallic signal line.

BRIEF DESCRIPTION OF THE DRAWINGS

In order to more clearly illustrate embodiments of the disclosure, following figures described in embodiments will be briefly introduced, it is obvious that the drawings are merely some embodiments of the disclosure, a person skilled in the art can obtain other figures according to these figures without creativity.

DETAILED DESCRIPTION OF PREFERRED EMBODIMENTS

Embodiments of the disclosure will be described in detail with reference to the accompanying drawings as follows.

Figure 1:
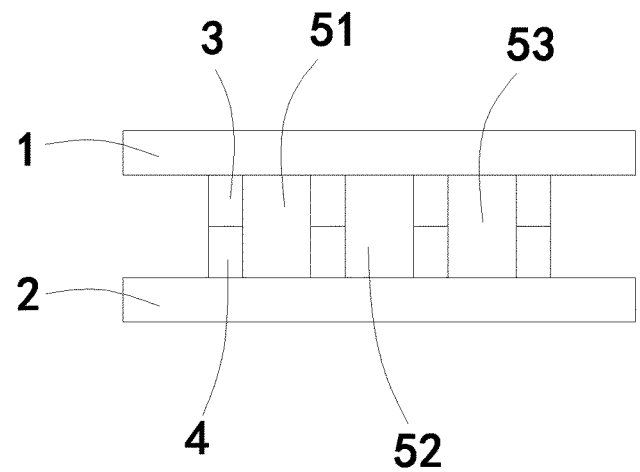
FIG. 1 is a schematic, structural view of an OLED display screen according to a preferred embodiment of the disclosure.
Figure 2:
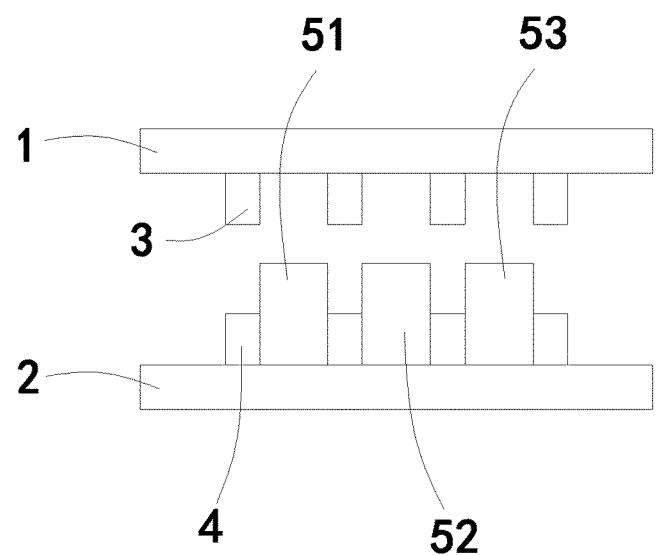
FIG. 2 is a disassembled schematic, structural view of an OLED display screen according to a first preferred embodiment of the disclosure.
Figure 3:
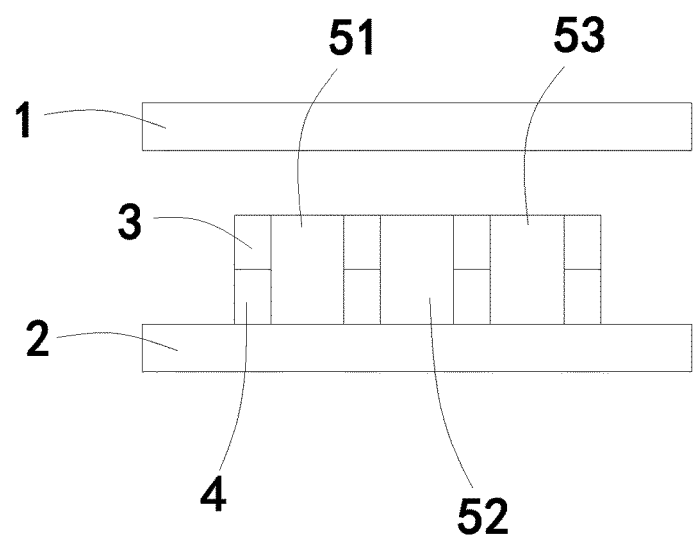
FIG. 3 is a disassembled schematic, structural view of an OLED display screen according to a second preferred embodiment of the disclosure.

It can be learnt from FIG. 1 to FIG. 3 that an OLED display screen of the disclosure includes a first substrate 1, a second substrate 2, an OLED light-emitting layer and a metallic signal line 4. The first substrate 1 and the second substrate 2 are disposed opposite. The OLED light-emitting layer and the metallic signal line 4 are both disposed between the first substrate 1 and the second substrate 2. A light block layer 3 is disposed between the first substrate 1 and the second substrate 2. All or a section of the light block layer 3 is disposed between the metallic signal line 4 and the first substrate 1. The light block layer 3 is applied to prevent incidence of natural light and/or emission of reflective light generated by the metallic signal line 4.

In practical application, in order to eliminate reflective light generated by the metallic signal line 4, a polarizer will be disposed on a surface of the OLED display screen to absorb the reflective light, but the polarizer will also absorb optical energy radiated from the OLED display screen, which will diminish illuminous efficiency of the OLED display screen significantly.

In order to solve the problem, the embodiment removes the polarizer, so that the problem that the polarizer absorbs the optical energy radiated from the OLED display screen no longer exists, which can increase the illuminous efficiency of the OLED display screen significantly.

However, as the polarizer has been removed, the reflective light generated by the metallic signal line 4 would be emitted to outside of the OLED display screen, which weakens the display effect of the OLED display screen. In order to solve the problem, the embodiment disposes the light block layer 3 between the first substrate 1 and the second substrate 2. All or a section of the light block layer 3 is disposed between the metallic signal line 4 and the first substrate 1. The light block layer 3 is applied to prevent incidence of natural light and/or emission of reflective light generated by the metallic signal line 4, so as to solve the problem of the reflective light from the metallic signal line 4. Moreover, the light block layer 3 has various choices, such as the light block layer 3 can be opaque material, so that the natural light cannot illuminate the metallic signal line 4, and the problem of the emission of the reflective light generated by the metallic signal line 4 is no longer existing, or such as the light block layer 3 can be a specific filter, the filter can absorb the reflective light generated by the metallic signal line 4 to solve the problem of emission of the reflective light generated by the metallic signal line 4. So the core of the embodiment is to block off light by the light block layer 3 from inside and/or outside, a person skilled in the art can select material to produce the light block layer 3 according to the practical requirement.

It needs to be pointed out that the light block layer 3 is possible to absorb the optical energy of the OLED display screen, but the amount of absorption is far less than that of the polarizer, as the polarizer covers the entire surface of the OLED display screen, the polarizer will absorb optical energy generated by the entire OLED display screen, yet the light block layer 3 is merely disposed on the metallic signal line 4, which means an area of the light block layer 3 can only shelter the metallic signal line 4, or be a little larger than the metallic signal line 4, it can be illustrated that the area of the light block layer 3 is far smaller than the polarizer in the conventional technique, therefore, even if the light block layer 3 can possibly absorb optical energy of the OLED display screen, the small amount of absorption can be ignored, the disposition of the light block layer 3 still improves the illuminous efficiency of the OLED display screen significantly.

A preferred embodiment of the disclosure is shown in FIG. 2, the light block layer 3 is fixed on an internal surface of the first substrate 1. A surface of the metallic signal line 4 opposite to the light block layer 3 is disposed within a range covered by the light block layer 3.

In practical application, the light block layer 3 needs to be fixed between the first substrate 1 and the second substrate 2, but a space between the first substrate 1 and the second substrate 2 is quite small, so that a manner to fix the light block layer 3 with efficient space utilization is a critical problem. In order to solve the problem, the embodiment fixes the light block layer 3 on the internal surface of the first substrate 1 directly, the surface of the metallic signal line 4 opposite to the light block layer 3 is disposed within a range covered by the light block layer 3, the light block layer 3 is fixed and sheltering the metallic signal line 4 without adding other coordinated structures, a space utilization rate between the first substrate 1 and the second substrate 2 is thereby improved.

A preferred embodiment of the disclosure is shown in FIG. 3, the light block layer 3 is fixed on a surface of the metallic signal line 4 opposite to first substrate 1. A surface of the metallic signal line 4 opposite to the light block layer 3 is disposed within a range covered by the light block layer 3.

In practical application, the light block layer 3 needs to be fixed between the first substrate 1 and the second substrate 2, but a space between the first substrate 1 and the second substrate 2 is quite small, so that a manner to fix the light block layer 3 with efficient space utilization is a critical problem. In order to solve the problem, the embodiment fixes the light block layer 3 on the surface of the metallic signal line 4 opposite to first substrate 1 directly, the surface of the metallic signal line 4 opposite to the light block layer 3 is disposed within a range covered by the light block layer 3, the light block layer 3 is fixed and sheltering the metallic signal line 4 without adding other coordinated structures, a space utilization rate between the first substrate 1 and the second substrate 2 is thereby improved.

A preferred embodiment of the disclosure is shown as FIG. 1 to FIG. 3, the OLED light-emitting layer is an RGB light-emitting layer (R is red, G is green, B is blue), the RGB light-emitting layer includes a red light emitter 51, a green light emitter 52 and a blue light emitter 53, the red light emitter 51, the green light emitter 52 and the blue light emitter 53 are disposed abreast and separately.

In practical application, the OLED light-emitting layer has various choices, such as:

1. an RGB light-emitting layer with the red light emitter 51, the green light emitter 52 and the blue light emitter 53 that can emit red, green and blue light respectively, which can vivify the display effect;

2. white light+a color filter, utilizing the white light as backlight, the white light penetrates the color filter to be red, green and blue light with low costs, but the display effect is poor;

3. blue light+a color converter, the blue light penetrates the color converter to be red, green and blue light, but the color converter is hard to develop and the application thereof is limited.

Overall, requirement for visual enjoyment is increasing along with development of human life, hence it is more critical to provide an OLED display screen with better quality. Therefore, the embodiment prefers to select the RGB light-emitting layer to improve the display quality of an OLED display screen to the maximum extent.

A preferred embodiment of the disclosure is shown as FIG. 1 to FIG. 3, a mounting groove is formed between two of the red light emitter 51, the green light emitter 52 and the blue light emitter 53 respectively. The metallic signal line 4 is disposed in the mounting groove.

In practical application, the RGB light-emitting layer almost occupies the whole space between the first substrate 1 and the second substrate 2, it is critical to arrange the metallic signal line 4 in a limited space properly. It needs to be pointed out that in order to guarantee correct operation of the red light emitter 51, the green light emitter 52 and the blue light emitter 53, the red light emitter 51, the green light emitter 52 and the blue light emitter 53 are required to be separated mutually, thereby interspace must be appeared between any two of the red light emitter 51, the green light emitter 52 and the blue light emitter 53, so the embodiment adopts the interspace between any two of the red light emitter 51, the green light emitter 52 and the blue light emitter 53 to be a mounting groove for solving the problem of proper arrangement of the metallic signal line 4, the metallic signal line 4 can be arranged in the mounting groove, which means an extra space for arranging the metallic signal line 4 is unnecessary to be remained, the arrangement is reasonable and structural compaction of the OLED display screen is improved significantly.

A preferred embodiment of the disclosure is shown in FIG. 2, the light block layer 3 is fixed in an internal surface of the first substrate 1. A position of the light block layer 3 is corresponding to a position of the mounting groove. The light block layer 3 is embedded in the mounting groove. A surface of the metallic signal line 4 opposite to the light block layer 3 is disposed within a range covered by the light block layer 3.

In practical application, the light block layer 3 needs to be fixed between the first substrate 1 and the second substrate 2, but a space between the first substrate 1 and the second substrate 2 is quite small, so that a manner to fix the light block layer 3 with efficient space utilization is a critical problem. In order to solve the problem, the embodiment fixes the light block layer 3 on the internal surface of the first substrate 1 directly, and embeds the light block layer 3 in the mounting groove, the light block layer 3 is fixed and sheltering the metallic signal line 4 without additional structures, or extending the space between the first substrate 1 and the second substrate 2, a space utilization rate between the first substrate 1 and the second substrate 2 is thereby improved.

A preferred embodiment of the disclosure is shown in FIG. 3, the light block layer 3 is disposed in the mounting groove. The light block layer 3 is fixed on a surface of the metallic signal line 4 opposite to the first substrate 1. A surface of the metallic signal line 4 opposite to the light block layer 3 is disposed within a range covered by the light block layer 3.

In practical application, the light block layer 3 needs to be fixed between the first substrate 1 and the second substrate 2, but a space between the first substrate 1 and the second substrate 2 is quite small, so that a manner to fix the light block layer 3 with efficient space utilization is a critical problem. In order to solve the problem, the embodiment disposes the light block layer 3 in the mounting groove directly, and the surface of the metallic signal line 4 opposite to the light block layer 3 is disposed within a range covered by the light block layer 3, the light block layer 3 is fixed and sheltering the metallic signal line 4 without additional structures, or extending the space between the first substrate 1 and the second substrate 2, a space utilization rate between the first substrate 1 and the second substrate 2 is thereby improved.

A preferred embodiment of the disclosure is shown in FIG. 2, the OLED light-emitting layer is an RGB light-emitting layer. The RGB light-emitting layer includes the red light emitter 51, the green light emitter 52 and the blue light emitter 53. The red light emitter 51, the green light emitter 52 and the blue light emitter 53 are disposed abreast and separately. The light block layer 3 is fixed on the internal surface of the first substrate 1. The surface of the metallic signal line 4 opposite to the light block layer 3 is disposed within a range covered by the light block layer 3.

Overall, the embodiment applies the RGB light-emitting layer to ensure a vivid display effect and improve display quality of the OLED display screen to the maximum extent. And the embodiment fixes the light block layer 3 on the internal surface of the first substrate 1 directly. The surface of the metallic signal line 4 opposite to the light block layer 3 is disposed within a range covered by the light block layer 3. So that the light block layer 3 is fixed and sheltering the metallic signal line 4 without additional coordinated structures, a space utilization rate between the first substrate 1 and the second substrate 2 is thereby improved.

A preferred embodiment of the disclosure is shown in FIG. 3, the OLED light-emitting layer is an RGB light-emitting layer. The RGB light-emitting layer includes the red light emitter 51, the green light emitter 52 and the blue light emitter 53. The red light emitter 51, the green light emitter 52 and the blue light emitter 53 are disposed abreast and separately. The light block layer 3 is fixed on the surface of the metallic signal line 4 opposite to the first substrate 1. The surface of the metallic signal line 4 opposite to the light block layer 3 is disposed within a range covered by the light block layer 3.

Overall, the embodiment applies the RGB light-emitting layer to ensure a vivid display effect and improve display quality of the OLED display screen to the maximum extent. And the embodiment fixes the light block layer 3 on the surface of the metallic signal line 4 opposite to the first substrate 1 directly. The surface of the metallic signal line 4 opposite to the light block layer 3 is disposed within a range covered by the light block layer 3. So that the light block layer 3 is fixed and sheltering the metallic signal line 4 without additional coordinated structures, the space utilization rate between the first substrate 1 and the second substrate 2 is thereby improved.

A preferred embodiment of the disclosure is as follows, the light block layer 3 is a light filter, a black matrix or a flat layer.

The light filter is a common optical device that can pass light with some wavelengths and block off light with other wavelengths, a proper light filter applied to be the light block layer 3 can prevent incidence of natural light and/or emission of reflective light generated by the metallic signal line 4.

The black matrix (BM) is resin material with excessively low optical transmittance, so the black matrix applied to be the light block layer 3 can prevent incidence of natural light and/or emission of reflective light generated by the metallic signal line 4.

The flat layer is also known as overcoating (OC), which is resin material, the material has a function of preventing reflective light from metal, and the material appears a flat surface after solidification, yet a common LCD is uneven on a surface of a CF or a TFT, a flat layer is generally added on the LCD to flatten the surface. And the embodiment applies the flat layer on the OLED display screen, as the flat layer is transparent, the flat layer will not influence the optical transmittance. The additional disposition of the light block layer 3 with the material of the flat layer can diminish reflective light of the metallic signal line 4 without affecting light penetration.

Obviously, the embodiments mentioned above can be applied alone or in combination, two preferred embodiments of the disclosure are specifically as shown in FIG. 1 to FIG. 3.

Preferred Embodiment One

As shown in FIG. 1 and FIG. 3, the OLED display screen includes the first substrate 1, the second substrate 2, an RGB light-emitting layer, the metallic signal line 4 and the light block layer 3. The first substrate 1 and the second substrate 2 are disposed opposite. The RGB light-emitting layer is disposed between the first substrate 1 and the second substrate 2. The RGB light-emitting layer includes the red light emitter 51, the green light emitter 52 and the blue light emitter 53. The red light emitter 51, the green light emitter 52 and the blue light emitter 53 are disposed separately on an identical horizontal surface to form a mounting groove between two of the red light emitter 51, the green light emitter 52 and the blue light emitter 53, the metallic signal line 4 is disposed in the mounting groove. The light block layer 3 is disposed in the mounting groove, the light block layer 3 is fixed on the surface of the metallic signal line 4 opposite to the first substrate 1. The surface of the metallic signal line 4 opposite to the light block layer 3 is disposed within a range covered by the light block layer 3. The light block layer 3 is preferably any one of a light filter, a black matrix or a flat layer.

In the embodiment, it is necessary to produce the light block layer 3 on a lower surface of the first substrate 1, then embed the light block layer 3 in the mounting groove.

Preferred Embodiment Two

As shown in FIG. 1 and FIG. 2, the OLED display screen includes the first substrate 1, the second substrate 2, the RGB light-emitting layer, the metallic signal line 4 and the light block layer 3. The first substrate 1 and the second substrate 2 are disposed opposite. The RGB light-emitting layer is disposed between the first substrate 1 and the second substrate 2. The RGB light-emitting layer includes the red light emitter 51, the green light emitter 52 and the blue light emitter 53. The red light emitter 51, the green light emitter 52 and the blue light emitter 53 are disposed separately on an identical horizontal surface to form a mounting groove between two of the red light emitter 51, the green light emitter 52 and the blue light emitter 53, the metallic signal line 4 is disposed in the mounting groove. The light block layer 3 is fixed on the internal surface of the first substrate 1, a position of the light block layer 3 and that of the mounting groove is corresponding, the light block layer 3 is embedded in the mounting groove. The surface of the metallic signal line 4 opposite to the light block layer 3 is disposed within a range covered by the light block layer 3. The light block layer 3 is preferably any one of a light filter, a black matrix or a flat layer.

In the embodiment, it needs to dispose the light block layer 3 in the mounting groove on the metallic signal line 4, then paste the first substrate 1 and the RGB light-emitting layer.

Overall, structures of products of the first preferred embodiment and the second preferred embodiment are basically the same, a difference is the position fixing the light block layer 3, which can lead to different manufacture processes. The light block layer 3 can prevent incidence of natural light and/or emission of reflective light generated by the metallic signal line 4 due to its specific property. Not only solves the problem of reflective light of the metallic signal line 4, the illuminous efficiency of the OLED display screen is also improved significantly as removal of the polarizer.

Above are preferred embodiments of the disclosure, to a person skilled in the art, any modification or improvement within the spirit and principles of the disclosure should be covered by the protected scope of the disclosure.

What is claimed is:

1. An OLED display screen, comprising a first substrate, a second substrate, an OLED light-emitting layer and a metallic signal line, the first substrate and the second substrate being disposed opposite, the OLED light-emitting layer and the metallic signal line being disposed between the first substrate and the second substrate, a light block layer being disposed between the first substrate and the second substrate, all or a section of the light block layer being disposed between the metallic signal line and the first substrate, and the light block layer being a material of preventing incidence of natural light and/or emission of reflective light generated by the metallic signal line, wherein the OLED light-emitting layer is an RGB light-emitting layer, the RGB light-emitting layer comprises a red light emitter, a green light emitter and a blue light emitter, the red light emitter, the green light emitter and the blue light emitter are disposed abreast and separately, and, wherein a mounting groove is formed between two of the red light emitter, the green light emitter and the blue light emitter respectively, the metallic signal line is disposed in the mounting groove.

2. The OLED display screen according to claim 1, wherein the light block layer is a light filter, a black matrix or a flat layer.

3. The OLED display screen according to claim 1, wherein the light block layer is fixed on a surface of the first substrate opposite to the second substrate, and a surface of the metallic signal line opposite to the light block layer is disposed within a range covered by the light block layer.

4. The OLED display screen according to claim 3, wherein the light block layer is a light filter, a black matrix or a flat layer.

5. The OLED display screen according to claim 1, wherein the light block layer is fixed on a surface of the metallic signal line opposite to the first substrate, a surface of the metallic signal line opposite to the light block layer is disposed within a range covered by the light block layer.

6. The OLED display screen according to claim 5, wherein the light block layer is a light filter, a black matrix or a flat layer.

7. The OLED display screen according to claim 1, wherein the light block layer is fixed in a surface of the first substrate opposite to the second substrate, and a position of the light block layer is corresponding to a position of the mounting groove, the light block layer is embedded in the mounting groove, a surface of the metallic signal line opposite to the light block layer is disposed within a range covered by the light block layer.

8. The OLED display screen according to claim 7, wherein the light block layer is a light filter, a black matrix or a flat layer.

9. The OLED display screen according to claim 1, wherein the light block layer is disposed in the mounting groove, the light block layer is fixed on a surface of the metallic signal line opposite to the first substrate, a surface of the metallic signal line opposite to the light block layer is disposed within a range covered by the light block layer.

10. The OLED display screen according to claim 9, wherein the light block layer is a light filter, a black matrix or a flat layer.

11. The OLED display screen according to claim 1, wherein the OLED light-emitting layer is an RGB light-emitting layer, the RGB light-emitting layer comprises a red light emitter, a green light emitter and a blue light emitter, the red light emitter, the green light emitter and the blue light emitter are disposed abreast and separately;

the light block layer being fixed on a surface of the first substrate opposite to the second substrate, and a surface of the metallic signal line opposite to the light block layer being disposed within a range covered by the light block layer.

12. The OLED display screen according to claim 11, wherein the light block layer is a light filter, a black matrix or a flat layer.

13. The OLED display screen according to claim 1, wherein the OLED light-emitting layer is an RGB light-emitting layer, the RGB light-emitting layer comprises a red light emitter, a green light emitter and a blue light emitter, the red light emitter, the green light emitter and the blue light emitter are disposed abreast and separately;

the light block layer being fixed on a surface of the metallic signal line opposite to the first substrate, a surface of the metallic signal line opposite to the light block layer being disposed within a range covered by the light block layer.

14. The OLED display screen according to claim 13, wherein the light block layer is a light filter, a black matrix or a flat layer.

\* \* \* \* \*